(12) United States Patent
Bai

(10) Patent No.: US 10,996,721 B2
(45) Date of Patent: May 4, 2021

(54) DISPLAY SCREEN AND TERMINAL

(71) Applicant: BEIJING XIAOMI MOBILE SOFTWARE CO., LTD., Beijing (CN)

(72) Inventor: Jian Bai, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 16/699,533

(22) Filed: Nov. 29, 2019

(65) Prior Publication Data

US 2021/0041923 A1    Feb. 11, 2021

(30) Foreign Application Priority Data

Aug. 9, 2019    (CN) .......................... 201910735314.9

(51) Int. Cl.
*G06F 1/18* (2006.01)
*H01L 27/32* (2006.01)
*G02F 1/1362* (2006.01)
*G06F 1/16* (2006.01)

(52) U.S. Cl.
CPC ........ *G06F 1/189* (2013.01); *G02F 1/136286* (2013.01); *H01L 27/3276* (2013.01); *G06F 1/1626* (2013.01)

(58) Field of Classification Search
CPC .. G06F 1/189; G06F 1/1626; G02F 1/136286; H01L 27/3276
See application file for complete search history.

(56) References Cited

U.S. PATENT DOCUMENTS

| 2017/0236891 | A1 | 8/2017 | Koshihara et al. |
| 2018/0183008 | A1 | 6/2018 | Song et al. |
| 2018/0277040 | A1 | 9/2018 | Lee et al. |
| 2020/0211477 | A1* | 7/2020 | Lai ...................... H01L 27/3276 |

FOREIGN PATENT DOCUMENTS

| CN | 208607570 U | 3/2019 |
| CN | 209056269 U | 7/2019 |
| CN | 209071333 U | 7/2019 |
| KR | 20100104990 A | 9/2010 |
| WO | 2020087859 A1 | 5/2020 |

OTHER PUBLICATIONS

Extended European search report of counterpart EP application No. 19216889.6 dated Jun. 29, 2020.

* cited by examiner

*Primary Examiner* — Peter D McLoone
(74) *Attorney, Agent, or Firm* — Syncoda LLC; Feng Ma

(57) ABSTRACT

A terminal screen includes a substrate, and a display layer on the substrate. The display layer includes a primary display area and a secondary display layer. The secondary display area includes a plurality of pixels, each pixel including sub-pixels of at least three different colors, which includes a first color, a second color and a third color. In the secondary display area, a wiring for connecting the sub-pixels of the first color, a wiring for connecting the sub-pixels of the second color, and a wiring for connecting the sub-pixels of the third color are in a same layer.

18 Claims, 12 Drawing Sheets

DISPLAY SCREEN AND TERMINAL

CROSS-REFERENCE TO RELATED APPLICATION

This application claims priority to Chinese Patent Application 201910735314.9 filed on Aug. 9, 2019, the disclosure of which is hereby incorporated by reference in its entirety.

BACKGROUND

The mobile phone industry has an increasingly high pursuit for a screen-to-body ratio, and desires to produce a mobile phone that has a screen-to-body ratio of nearly 100%.

The difficulty in increasing the screen-to-body ratio of the mobile phone is: how to reasonably arrange functional devices (such as a camera, an earpiece, a light sensor, a distance sensor and a fingerprint sensor) on a front panel of the mobile phone to maximize the screen-to-body ratio. In the related art, a technical idea of arranging the above functional devices below a mobile phone screen is proposed. By arranging the above functional devices below the mobile phone screen, a space occupied by these functional devices on the front panel of the mobile phone may be released sufficiently, such that the screen-to-body ratio is increased.

SUMMARY

Embodiments of the present disclosure provide a terminal screen and a terminal, which can be used to solve the problem that, after optical devices are arranged below the terminal screen, the working performances of these optical devices may be affected or even these optical devices fail to work normally due to the light transmission of the terminal screen. The technical solutions are described as follows.

According to a first aspect of the embodiments of the present disclosure, there is provided a terminal screen, comprising a substrate, and a display layer on the substrate, wherein the display layer comprises a primary display area and a secondary display area;

the secondary display area comprises a plurality of pixels, each pixel comprising sub-pixels of at least three different colors which comprises a first color, a second color and a third color; and in the secondary display area, a wiring for connecting the sub-pixels of the first color, a wiring for connecting the sub-pixels of the second color, and a wiring for connecting the sub-pixels of the third color are in a same layer.

In some embodiments, the wiring for connecting the sub-pixels of the first color, the wiring for connecting the sub-pixels of the second color, the wiring for connecting the sub-pixels of the third color, the sub-pixels of the first color, the sub-pixels of the second color and the sub-pixels of the third color are located in the same layer.

In some embodiments, the secondary display area includes at least one pixel group, each of the pixel groups including n pixel units which are arranged in a first direction, where n is an integer greater than 1;

the n pixel units include first pixel units and second pixel units that are arranged alternately in the first direction; each of the first pixel units comprises three sub-pixels arranged in a second direction, and the arrangement sequence of the three sub-pixels included in the first pixel unit is as follows: the sub-pixel of the first color, the sub-pixel of the second color, and the sub-pixel of the third color; the second pixel unit comprises three sub-pixels arranged in the second direction, and the arrangement sequence of the three sub-pixels included in the second pixel unit is as follows: the sub-pixel of the third color, the sub-pixel of the first color and the sub-pixel of the second color; the first direction is perpendicular to the second direction;

for each pixel group, the sub-pixels of the first color in each first pixel unit and the sub-pixels of the first color in each second pixel unit are sequentially connected one by one by a first wiring; the sub-pixels of the second color in each first pixel unit and the sub-pixels of the second color in each second pixel unit are sequentially connected one by one by a second wiring; the sub-pixels of the third color in each first pixel unit are sequentially connected one by one by a third wiring; the sub-pixels of the third color in each second pixel unit are sequentially connected one by one by a fourth wiring; and the first wiring, the second wiring, the third wiring and the fourth wiring are located in the same layer.

In some embodiments, the third wiring extends outwards from the secondary display area and is connected to a first pixel control circuit located outside the secondary display area; and the fourth wiring extends outwards from the secondary display area and is connected to a second pixel control circuit located outside the secondary display area.

In some embodiments, the first pixel control circuit and the second pixel control circuit are the same pixel control circuit;

or the first pixel control circuit and the second pixel control circuit are different pixel control circuits.

In some embodiments, the third wiring is connected to the fourth wiring in the secondary display area, and the fourth wiring extends outwards from the secondary display area and is connected to the pixel control circuit located outside the secondary display area;

or the fourth wiring is connected to the third wiring in the secondary display area, and the third wiring extends outwards from the secondary display area and is connected to the pixel control circuit located outside the secondary display area.

In some embodiments, the first wiring, the second wiring, the third wiring and the fourth wiring are located in a first layer;

a second layer is located above or below the first layer and includes a crossover line;

one end of the third wiring is connected to one end of the crossover line, and the other end of the crossover line is connected to the fourth wiring;

or one end of the fourth wiring is connected to one end of the crossover line, and the other end of the crossover line is connected to the third wiring.

In some embodiments, the first color is red, the second color is green, and the third color is blue; or the first color is red, the second color is blue, and the third color is green; or the first color is green, the second color is red, and the third color is blue; or the first color is green, the second color is blue, and the third color is red; or the first color is blue, the second color is red, and the third color is green; or the first color is blue, the second color is green, and the third color is red.

In some embodiments, the display layer further comprises a transition display area, the transition display area being located between the primary display area and the secondary display area.

In some embodiments, the secondary display area is located at a notch formed on a top edge of the primary display area; and/or the secondary display area is located at a notch formed on a left edge of the primary display area; and/or the secondary display area is located at a notch formed on a right edge of the primary display area; and/or the secondary display area is located at a notch formed on a bottom edge of the primary display area; and/or the secondary display area is located at a notch formed in the middle of the primary display area.

According to a second aspect of the embodiments of the present disclosure, there is provided a terminal, comprising the terminal screen as described in the first aspect.

According to a third aspect of the embodiments of the present disclosure, there is provided a terminal, comprising a terminal screen, wherein the terminal screen comprises a substrate, and a display layer on the substrate;

the display layer comprises a primary display area and a secondary display area;

the secondary display area comprises a plurality of pixels, each pixel comprising sub-pixels of at least three different colors which comprises a first color, a second color and a third color; and in the secondary display area, a wiring for connecting the sub-pixels of the first color, a wiring for connecting the sub-pixels of the second color, and a wiring for connecting the sub-pixels of the third color are in a same layer; and an optical device is below the secondary display area.

In some embodiments, the optical devices include at least one of the followings: a camera, a light sensor, a proximity sensor, an optical transmitter, and an optical receiver.

According to a third aspect of the embodiments of the present disclosure, there is provided a terminal screen, comprising a plurality of pixels, each pixel comprising sub-pixels of at least three different colors which comprises a first color, a second color, and a third color; and in the terminal screen, a wiring for connecting the sub-pixels of the first color, a wiring for connecting the sub-pixels of the second color, and a wiring for connecting the sub-pixels of the third color are in a same layer.

In some embodiments, the terminal screen comprises at least one pixel group, each of the pixel groups including n pixel units which are arranged in a first direction, where n is an integer greater than 1;

the n pixel units include first pixel units and second pixel units that are arranged alternately in the first direction; each of the first pixel units comprises three sub-pixels arranged in a second direction, and the arrangement sequence of the three sub-pixels included in the first pixel unit is as follows: the sub-pixel of the first color, the sub-pixel of the second color, and the sub-pixel of the third color; the second pixel unit comprises three sub-pixels arranged in the second direction, and the arrangement sequence of the three sub-pixels included in the second pixel unit is as follows: the sub-pixel of the third color, the sub-pixel of the first color and the sub-pixel of the second color; the first direction is perpendicular to the second direction;

for each pixel group, the sub-pixels of the first color in each first pixel unit and the sub-pixels of the first color in each second pixel unit are sequentially connected one by one by a first wiring; the sub-pixels of the second color in each first pixel unit and the sub-pixels of the second color in each second pixel unit are sequentially connected one by one by a second wiring; the sub-pixels of the third color in each first pixel unit are sequentially connected one by one by a first wiring; the sub-pixels of the third color in each second pixel unit are sequentially connected one by one by a fourth wiring; and the first wiring, the second wiring, the third wiring and the fourth wiring are located in the same layer.

According to a fourth aspect of the embodiments of the present disclosure, there is provided a terminal, comprising the terminal screen as described in the third aspect.

The technical solutions provided by the embodiments of the present disclosure may include the following beneficial effects:

the wirings of the sub-pixels of three different colors in the secondary display area are arranged in the same layer, such that the number of layers of the terminal screen may be reduced, and metal via holes for connecting the wirings and the sub-pixels across layers are not required, thereby further improving the light transmittance of the terminal screen. In this way, optical devices such as a camera, a light sensor, a proximity sensor, an optical transmitter and an optical receiver may be arranged below the secondary display area. In addition, these optical devices can be ensured to work normally to furthest ensure the working performances of the optical devices.

It is to be understood that both the foregoing general description and the following detailed description are exemplary and explanatory only and are not intended to limit the present disclosure.

BRIEF DESCRIPTION OF THE DRAWINGS

The accompanying drawings, which are incorporated in and constitute a part of this disclosure, illustrate embodiments consistent with the present disclosure and, together with the description, serve to explain the principles of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of devices and methods consistent with aspects related to the disclosure as recited in the appended claims.

For some optical devices (such as a camera, a light sensor, an infrared transmitter and an infrared receiver) that need to receive or emit light in operation, after these optical devices are arranged below the mobile phone screen, the working performances of these optical devices may be affected or even these optical devices fail to work normally due to the light transmission of the mobile phone screen.

The terminal screen includes a plurality of pixels, each pixel generally including sub-pixels of three different colors R (red), G (green), and B (blue). In the traditional scheme, each sub-pixel has a separate pixel control circuit, that is, one pixel corresponds to three pixel control circuits, and each pixel control circuit is separately connected to one sub-pixel so as to control the sub-pixel, e.g., control the sub-pixel to emit color. Since each pixel control circuit includes components such as a TFT (Thin Film Transistor), and the sub-pixels and the pixel control circuit also need to be connected by a wiring, such that a large number of pixel control circuits and a dense layout of the wirings result in poor light transmission of the terminal screen, which cannot guarantee the normal operation of the optical devices under the screen.

Figure 1:
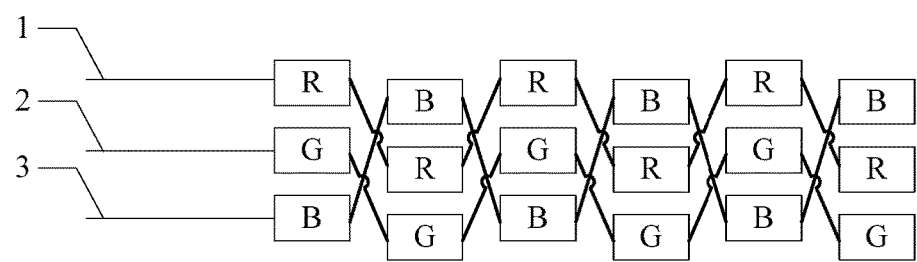
FIG. 1 is a schematic diagram of a terminal according to some embodiments.

To improve the light transmittance of the terminal screen, a scheme is proposed in which a plurality of sub-pixels of the same color are connected by one wiring which is then connected to a pixel control circuit. As shown in FIG. 1, a plurality of red sub-pixels shares a wiring 1, a plurality of green sub-pixels shares a wiring 2, and a plurality of blue sub-pixels shares a wiring 3. In the above manner, the number of pixel control circuits can be reduced, the layout of the wirings can be simplified, and the light transmittance of the terminal screen can thus be improved.

As shown in FIG. 1, since the blue sub-pixels are interspersed between the red sub-pixels and the green sub-pixels, a crossover line occurs. That is, at least two layers of wirings are required to achieve the pixel connection shown in FIG. 1. The wiring 1 and the wiring 2 may be located in the same layer. Assuming that the sub-pixels of the respective colors are located in the first layer, the wiring 1 and the wiring 2 may also be located in the first layer; and the wiring 3 may not be in the same layer as the wiring 1 and the wiring 2 because of spatial limitation, and therefore, another layer is acquired, for example, the wiring 3 is located in a second layer. In addition, when the wiring 3 located in the second layer is connected to the blue sub-pixels in the first layer, a corresponding connection portion, such as a metal via hole, is required, and the electrical connection between the upper and lower layers is realized through the metal via hole.

Apparently, the more the number of the layers of the wirings, the worse the light transmittance of the terminal screen. In addition, the metal via holes will further reduce the light transmittance. Therefore, although such the design scheme in FIG. 1 can improve the light transmittance compared with the conventional scheme, it is still not excellent enough.

Various embodiments of the present application can make a further improvement on the basis of the design scheme of FIG. 1, or be implemented in the overall design scheme of FIG. 1, and realizes the arrangement of the wirings of the sub-pixels of three different colors in the same layer. In this way, the number of layers of the terminal screen may be reduced, and metal via holes for connecting the wirings and the sub-pixels across layers are not required, thereby further improving the light transmittance of the terminal screen.

Figure 2:
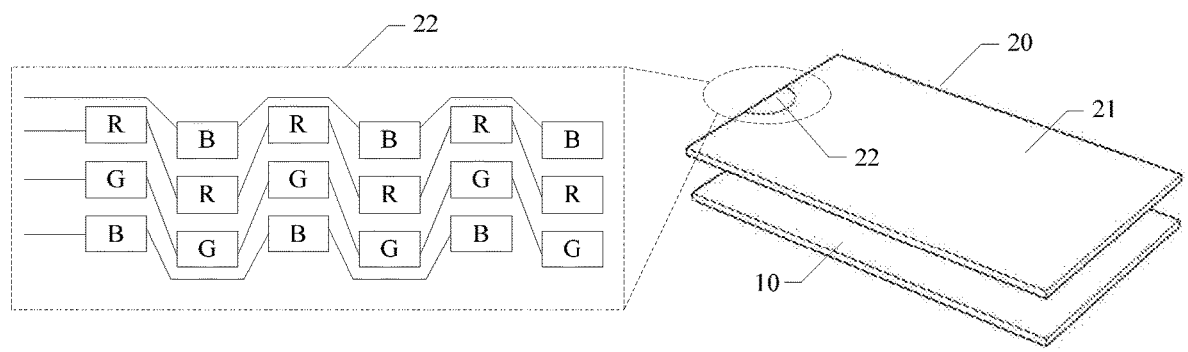
FIG. 2 is a schematic diagram of a terminal screen according to some embodiments of the present disclosure.

FIG. 2 is a schematic diagram of a terminal shown according to some embodiments. As shown in FIG. 2, the terminal screen may include a substrate 10, and a display layer 20 located on the substrate 10.

The display layer 20 is used to implement a display function of the terminal screen. In an embodiment of the present disclosure, the display layer 20 includes a primary display area 21 and a secondary display area 22. The primary display area 21 and the secondary display area 22 have a display function, respectively. One or more secondary display areas 22 may be provided. In FIG. 2, a schematic explanation is given by taking one secondary display area 22 as an example.

In some embodiments, the primary display area 21 is a display area having a relatively large area ratio in the display layer 20, and the secondary display area 22 is a display area having a relatively small area ratio in the display layer 20. That is, the area ratio of the primary display area 21 in the display layer 20 is larger than the area ratio of the secondary display area 22 in the display layer 20.

In an embodiment of the present disclosure, the display layer 20 includes two different types of display areas, i.e., a primary display area 21 and a secondary display area 22. However, the primary display area 21 and the secondary display area 22 are of a unified whole body in physical structure. That is, the display layer 20 is an integrated structure that is not divided into a plurality of mutually independent components. For example, the display layer 20 is arranged on a substrate 10 of an integrated structure. That is, the primary display area 21 and the secondary display area 22 are formed on one substrate. The substrate 10 may be made of a glass material or a flexible material such as PI (polyimide), which will not be limited in the embodiment of the present disclosure.

If the display layer 20 includes a plurality of mutually independent components, and these components are spliced to form the display layer 20, there must be a certain gap at the splicing position, resulting in a gap between display contents of the respective components. Therefore, the integral and gap-free display effect of the display contents of the entire display layer 20 cannot be achieved.

However, in the embodiment of the present disclosure, since the primary display area 21 and the secondary display area 22 are of a unified whole body in physical structure, and free of a gap therebetween, there is also no gap between the display content of the primary display area 21 and the display content of the secondary display area 22. Therefore, the integral and gap-free display effect of the display contents of the entire display layer 20 can be achieved.

In an embodiment of the present disclosure, the secondary display area 22 includes a plurality of pixels, each pixel including sub-pixels of at least three different colors, including a first color, a second color, and a third color. In some embodiments, the at least three different colors include R (red), G (green), and B (blue).

In the secondary display area 22, a wiring for connecting the sub-pixels of the first color, a wiring for connecting the sub-pixels of the second color, and a wiring for connecting the sub-pixels of the third color are located in the same layer. Exemplarily, as shown in FIG. 2, assuming that the first color is red, the second color is green, and the third color is blue, in the seconding display area 22, the wiring for connecting the red sub-pixels, the wiring for connecting the green sub-pixel, and the wiring for the blue sub-pixels are located in the same layer.

In some embodiments, in the secondary display area 22, the wiring for connecting the sub-pixels of the first color, the wiring for connecting the sub-pixels of the second color, the wiring for connecting the sub-pixels of the third color, the sub-pixels of the first color, the sub-pixels of the second color and the sub-pixels of the third color are all located in the same layer, that is, the sub-pixels and the wirings are located in the same layer. In an example, in the secondary display area 22, the wiring for connecting the red sub-pixels, the wiring for connecting the green sub-pixels, the wiring for connecting the blue sub-pixels, the red sub-pixels, the green sub-pixels and the blue sub-pixels are located in the same layer.

The terminal screen is of a stacked structure including a plurality of functional layers, the respective functional layers being stacked from top to bottom. Similarly, the secondary display area 22 may also include a plurality of functional layers, the respective functional layers being stacked from top to bottom. Different functional layers may be used to implement different functions, such as some functional layers for setting an anode, some functional layers for setting a cathode, some functional layers for setting sub-pixels, or some functional layers for setting wirings. In an embodiment of the present disclosure, A and B are located in the same layer, which means that A and B are located in the same functional layer. For example, in the secondary display area 22, the wiring for connecting the red sub-pixels, the wiring for connecting the green sub-pixels, and the wiring for connecting the blue sub-pixels are located in the same functional layer. In some embodiments, the wirings for the above-mentioned various color sub-pixels and the sub-pixels of various colors are located in the same functional layer. In some embodiments, in the same functional layer, the wirings for the above-mentioned sub-pixels of various colors are located in the same plane.

In the embodiment of the present disclosure, the pixel arrangement manner of the secondary display area 22 is not limited. For example, the pixel arrangement manner of the secondary display area 22 includes but is not limited to at least one of the followings: Delta arrangement, Diamond arrangement, PenTile arrangement, standard RGB arrangement, and the like.

Figure 3:
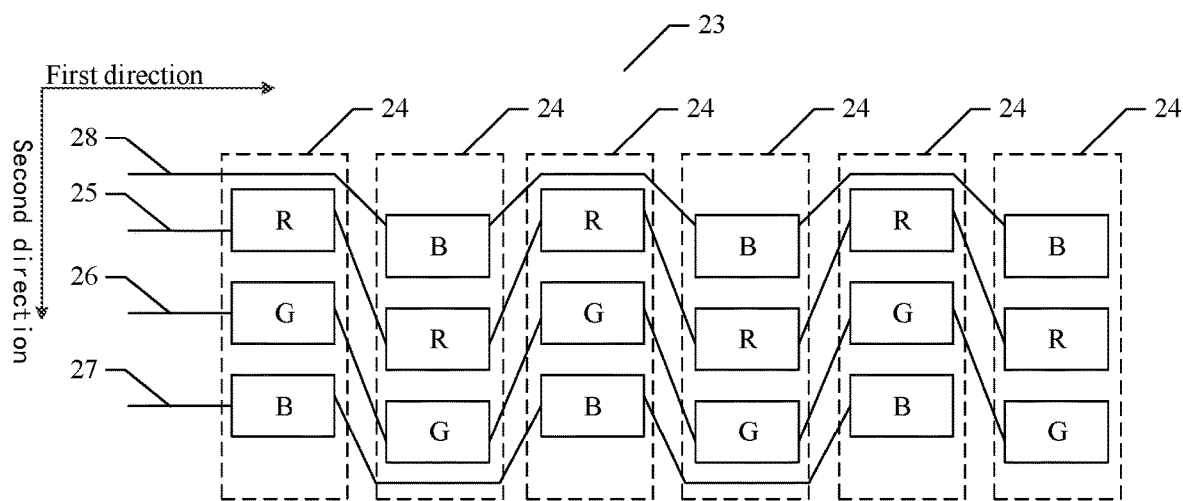
FIG. 3 is a first schematic diagram showing wiring distribution of pixel groups according to some embodiments of the present disclosure.
Figure 4:
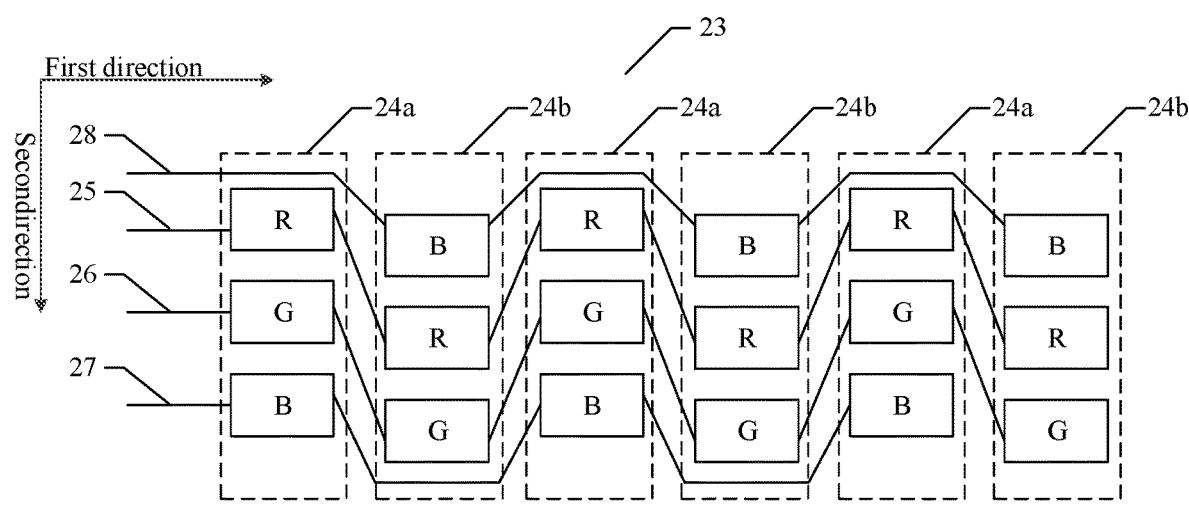
FIG. 4 is a second schematic diagram showing wiring distribution of pixel groups according to some embodiments of the present disclosure.

In an example, by reference with FIG. 3 and FIG. 4, the secondary display area 22 includes at least one pixel group 23, each of the pixel groups 23 including n pixel units 24 that are arranged in a first direction, where n is an integer greater than 1. For example, in FIG. 3 and FIG. 4, each pixel group 23 includes six pixel units 24 that are arranged in a first direction. In practical applications, the number of the pixel units 24 included in one pixel group 23 may be designed according to actual requirements, which will not be limited in the embodiment of the present disclosure.

The n pixel units 24 include first pixel units 24a and second pixel units 24b that are arranged alternately in a first direction. Each first pixel unit 24a includes three sub-pixels arranged in a second direction, and the arrangement sequence of the three sub-pixels included in the respective first pixel unit 24a is as follows: the sub-pixel of the first color, the sub-pixel of the second color, and the sub-pixel of the third color. Each second pixel unit 24b includes three sub-pixels arranged in the second direction, and the arrangement sequence of the three sub-pixels included in the second pixel unit 24b is as follows: the sub-pixel of the third color, the sub-pixel of the first color, and the sub-pixel of the second color. In addition, the first direction is perpendicular to the second direction.

As shown in FIG. 3 and FIG. 4, the first direction refers to a transverse direction, and the second direction refers to a longitudinal direction. The pixel group 23 includes first pixel units 24a and second pixel units 24b that are arranged alternately in the transverse direction. Each of the first pixel units 24a includes three sub-pixels that are arranged in the longitudinal direction, and the arrangement sequence of the three sub-pixels included in the first pixel unit 24a is as follows: the red sub-pixel (R), the green sub-pixel (G), and the blue sub-pixel (B). Each of the second pixel units 24b includes three sub-pixels that are arranged in the longitudinal direction, and the arrangement sequence of the three sub-pixels included in the second pixel unit 24b is as follows: the blue sub-pixel (B), the red sub-pixel (R), and the green sub-pixel (G).

For each pixel group 23, the sub-pixels of the first color in each first pixel unit 24a and the sub-pixels of the first color in each second pixel unit 24b are sequentially connected one by one through a first wiring 25; the sub-pixels of the second color in each first pixel unit 24a and the sub-pixels of the second color in each second pixel unit 24b are sequentially connected one by one through a second wiring 26; the sub-pixels of the third color in each first pixel unit 24a are sequentially connected one by one through a third wiring 27; and the sub-pixels of the third color in each second pixel unit 24b are sequentially connected one by one through a fourth wiring 28. The first wiring 25, the second wiring 26, the third wiring 27 and the fourth wiring 28 are located in the same layer.

As shown in FIG. 3 and FIG. 4, in each pixel group 23, the red sub-pixels (R) in each first pixel unit 24a and the red sub-pixels (R) in each second pixel unit 24b are sequentially connected one by one through a first wiring 25; the green sub-pixels (G) in each first pixel unit 24a and the green sub-pixels (G) in each second pixel unit 24b are sequentially connected one by one through a second wiring 26; the blue sub-pixels (B) in each first pixel unit 24a are sequentially connected one by one through a third wiring 27; and the blue sub-pixels (B) in each second pixel unit 24b are sequentially connected one by one through a fourth wiring 28. The first wiring 25, the second wiring 26, the third wiring 27 and the fourth wiring 28 are located in the same layer.

In the above manner, since the sub-pixels of the third color in each first pixel unit 24a are connected by one wiring, and the sub-pixels of the third color in each second pixel unit 24b are connected by another wiring, it is not necessary to connect the sub-pixels of the third color by means of a crossover line, such that the wirings for the sub-pixels of three different colors are arranged in the same layer. In this way, the number of layers of the terminal screen may be reduced, and metal via holes for connecting the wirings and the sub-pixels across layers are not required, thereby further improving the light transmittance of the terminal screen.

In addition, when each pixel includes three sub-pixels of R, G, and B, in some embodiments, the first color is red, the second color is green, and the third color is blue; or, the first color is red, the second color is blue, and the third color is green; or, the first color is green, the second color is red, and the third color is blue; or, the first color is green, the second color is blue and the third color is red; or, the first color is blue, the second color is red, and the third color is green; or, the first color is blue, the second color is green, and the third color is red. In FIG. 3 and FIG. 4, an exemplary description is made by taking the case where the first color is red, the second color is green, and the third color is blue as an example only, which will not be limitative to the technical solution of the present disclosure.

In addition, in the embodiment of the present disclosure, the pixel arrangement manner and the wiring manner of the primary display area 21 are not limited, and may be the same as or different from those of the secondary display area 22. In order to ensure the display performance of the primary display area 21, a conventional pixel arrangement manner and a conventional wiring manner, that is, each sub-pixel being independently controlled by an independent pixel control circuit, may be adopted for the primary display area 21. In this way, the light transmittance of the secondary display area 22 will be superior to that of the primary display area 21. Therefore, optical devices such as a camera, a light sensor, a proximity sensor, an optical transmitter and an optical receiver may be arranged below the secondary display area 22. In addition, these optical devices can work normally to furthest ensure the working performances of the optical devices.

It should be noted that the light transmission performance is an index for measuring the light transmission capacity of a medium (such as the primary display area 21 and the secondary display area 22 in the embodiment of the present disclosure). The light transmission performance may include transmittance and/or light transmission quality. The transmittance is a percentage of the luminous flux of light transmitted through a medium (such as the primary display area 21 and the secondary display area 22 in the embodiment of the present disclosure) to the luminous flux of incident light. The transmittance may also be referred to as a light transmittance. The light transmission quality refers to the quality of light transmitted through a medium (such as the primary display area 21 and the secondary display area 22 in the embodiment of the present disclosure). The characterization parameters of the light transmission quality include, but are not limited to, at least one of the followings: haze, SFR (Spatial Frequency Response), and MTF (Modulation Transfer Function), which correspond to a sharpness index of an image. In the embodiment of the present disclosure, an optical device may be arranged below the secondary display area 22. Since the secondary display area 22 has better transmittance and/or light transmission quality, the working performance of the optical device can be furthest ensured.

It should be further noted that, in the above embodiment, one pixel that includes sub-pixels of three colors R, G, and B is mainly described as an example. In another example, one pixel may further include sub-pixels of another color, such as white (W) sub-pixels, in addition to the sub-pixels of three colors R, G and B. Alternatively, the three colors R, G, and B may be replaced with other colors, which will not be limited in the embodiment of the present disclosure.

It should be further noted that, in the embodiment of the present disclosure, the wiring refers to a power line and/or a signal line for controlling pixel display. The power line is used to supply a voltage to the pixels. The signal line is used to supply a control signal, such as a pixel value (e.g., brightness or gray scale), to the pixels. The signal line may also be referred to as a data line.

In summary, in the technical solution provided by the present disclosure, the wirings for the sub-pixels of three different colors in the secondary display area are arranged in the same layer, such that the number of layers of the terminal screen may be reduced, and metal via holes for connecting the wirings and the sub-pixels across layers are not required, thereby further improving the light transmittance of the terminal screen. In this way, optical devices such as a camera, a light sensor, a proximity sensor, an optical transmitter and an optical receiver may be arranged below the secondary display area. In addition, these optical devices can be ensured to work normally to furthest ensure the working performances of the optical devices.

In some embodiments, the secondary display area 22 may include one or more (i.e., two or more) pixel groups 23. When the plurality of pixel groups 23 is included in the secondary display area 22, the structure (such as the number of pixels, the arrangement manner, or the like) of each of the pixel groups 23 may be the same or different, which will not be limited in the embodiment of the present disclosure.

Figure 5:
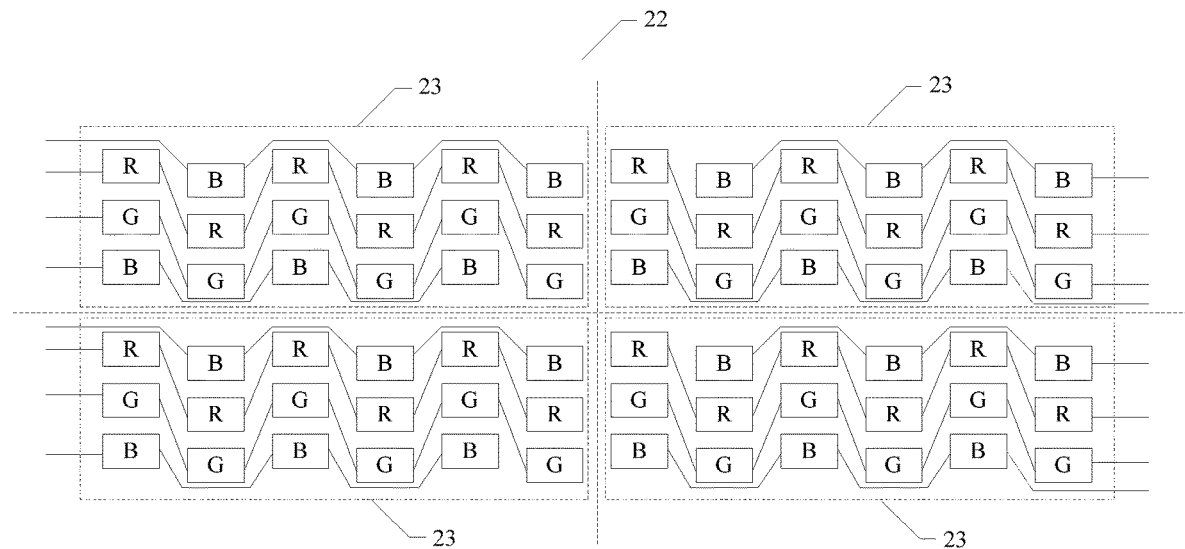
FIG. 5 is a first schematic diagram showing the arrangement of pixel groups in a secondary display area according to some embodiments of the present disclosure.

FIG. 5 is a schematic diagram exemplarily showing the arrangement of four pixel groups 23 included in the secondary display area 22. In FIG. 5, in order to more clearly distinguish respective pixel groups 23, the spacing between every two adjacent pixel groups 23 is enlarged. In an actual application, every two adjacent pixel groups 23 may be arranged more densely, which will not be limited in the embodiment of the present disclosure.

Figure 6:
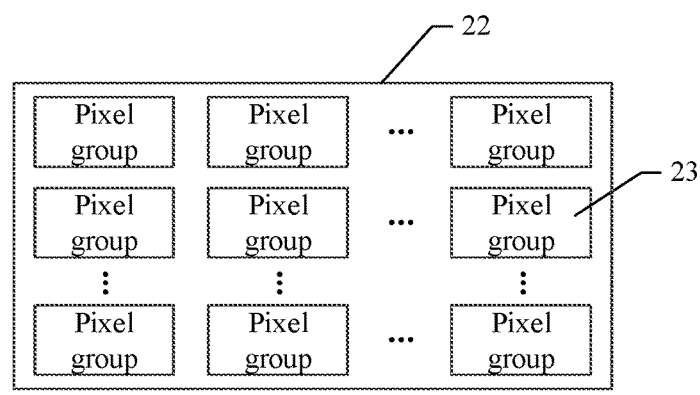
FIG. 6 is a second schematic diagram showing the arrangement of pixel groups in a secondary display area according to some embodiments of the present disclosure.

As shown in FIG. 6, the secondary display area 22 may include a greater number of pixel groups 23, the respective pixel groups 23 being arrayed in the secondary display area 22. The number and the arrangement manner of the pixel groups 23 included in the secondary display area 22 will not be specifically limited in the embodiment of the present disclosure.

In addition, in order to enable the sub-pixels in the secondary display area 22 to emit light, the sub-pixels in the secondary display area 22 need to be connected to a pixel control circuit through a wiring. In order to ensure the light transmittance of the secondary display area 22 as much as possible, the pixel control circuit for the sub-pixels in the secondary display area 22 may be arranged outside the secondary display area 22, for example, in the primary display area 21. In this way, the wiring in the secondary display area 22 needs to extend outwards from the secondary display area 22 and is connected to the pixel control circuit located outside the secondary display area 22.

Figure 7:
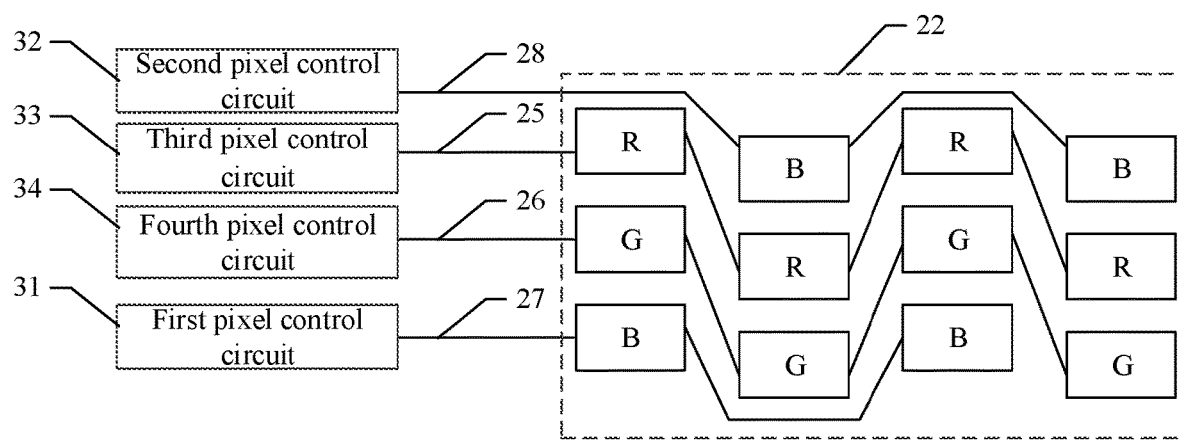
FIG. 7 is a schematic diagram showing the connection between the wirings in the secondary display area and a pixel control circuit according to some embodiments of the present disclosure.

In an example, as shown in FIG. 7, the third wiring 27 extends outwards from the secondary display area 22 and is connected to a first pixel control circuit 31 located outside the secondary display area 22; and the fourth wiring 28 extends outwards from the secondary display area 22 and is connected to a second pixel control circuit 32 located outside the secondary display area 22. In addition, the first wiring 25 extends outwards from the secondary display area 22 and is connected to a third pixel control circuit 33 located outside the secondary display area 22; and the second wiring 26 extends outwards from the secondary display area 22 and is connected to a fourth pixel control circuit 34 located outside the secondary display area 22. In the above manner, for the same pixel group 23, the sub-pixels of the same color are controlled using one pixel control circuit, and the sub-pixels of different colors are separately controlled using different pixel control circuits. In addition, the first pixel control circuit 31 and the second pixel control circuit 32 are the same pixel control circuit; or, the first pixel control circuit 31 and the second pixel control circuit 32 are two different pixel control circuits.

Figure 8:
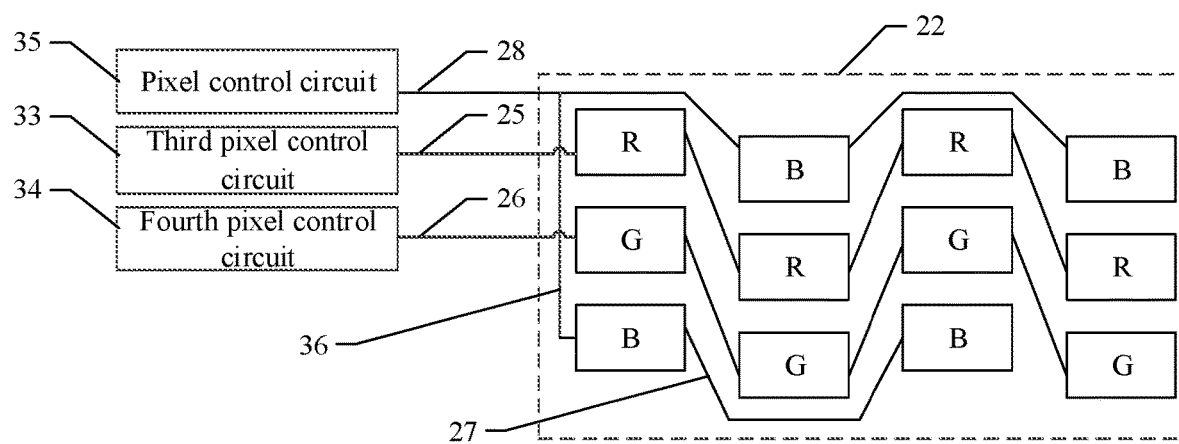
FIG. 8 is a first schematic diagram showing the connection between the wirings in the secondary display area and the pixel control circuit according to another exemplary embodiment of the present disclosure.

In another example, as shown in FIG. 8, the third wiring 27 is connected to a fourth wiring 28 in the secondary display area 22, and the fourth wiring 28 extends outwards from the secondary display area 22 and is connected to a pixel control circuit 35 located outside the secondary display area 22. In addition, the first wiring 25 extends outwards from the secondary display area 22 and is connected to a third pixel control circuit 33 located outside the secondary display area 22; and the second wiring 26 extends outwards from the secondary display area 22 and is connected to a fourth pixel control circuit 34 located outside the secondary display area 22. In the above manner, the third wiring 27 and the fourth wiring 28 are connected to the same pixel control circuit 35, and two groups of sub-pixels of the third color are simultaneously controlled by the pixel control circuit 35.

In this case of FIG. 8, in order to connect the third wiring 27 to the fourth wiring 28 in the secondary display area 22, the following design can be employed: the first wiring 25, the second wiring 26, the third wiring 27, and the fourth wiring 28 are located in a first layer; a second layer is arranged above or below the first layer, the second layer including a crossover line 36; one end of the third wiring 27 is connected to one end of the crossover line 36, and the other end of the crossover line 36 is connected to the fourth wiring 28. The crossover line 36 may be arranged in a functional layer located above or below the first layer, and the crossover line 36 and the other wirings (i.e., the first wiring 25, the second wiring 26, the third wiring 27, and the fourth wiring 28) are located in two different functional layers. The functional layer for setting the crossover line 36 may be a separate additional functional layer or a functional layer existing in the secondary display area 22, which will not be limited in the embodiment of the present disclosure. In addition, since the crossover line 36 and the third and fourth wirings 27, 28 are located in two different functional layers, the connection between the crossover line 36 and the third wiring 27 and the connection between the crossover line 36 and the fourth wiring 28 are achieved via metal via holes.

Figure 9:
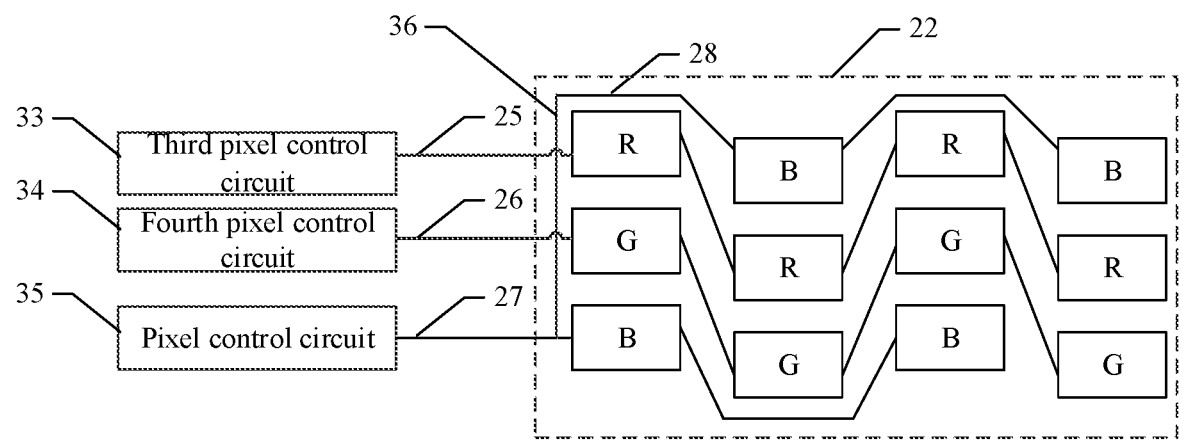
FIG. 9 is a second schematic diagrams showing the connection between the wirings in the secondary display area and the pixel control circuit according to another exemplary embodiment of the present disclosure.

In yet another example, as shown in FIG. 9, the fourth wiring 28 is connected to the third wiring 27 in the secondary display area 22, and the third wiring 27 extends outwards from the secondary display area 22 and is connected to the pixel control circuit 35 located outside the secondary display area 22. In addition, the first wiring 25 extends outwards from the secondary display area 22 and is connected to the third pixel control circuit 33 located outside the secondary display area 22; and the second wiring 26 extends outwards from the secondary display area 22 and is connected to the fourth pixel control circuit 34 located outside the secondary display area 22. In the above manner, the third wiring 27 and the fourth wiring 28 are connected to the same pixel control circuit 35, and two groups of sub-pixels of the third color are simultaneously controlled by the pixel control circuit 35.

In this case of FIG. 9, in order to connect the fourth wiring 28 to the third wiring 27 in the secondary display area 22, the following design can be employed: the first wiring 25, the second wiring 26, the third wiring 27, and the fourth wiring 28 are located in a first layer; a second layer is arranged above or below the first layer, the second layer including a crossover line 36; one end of the fourth wiring 28 is connected to one end of the crossover line 36, and the other end of the crossover line 36 is connected to the third wiring 27. The crossover line 36 may be arranged in a functional layer located above or below the first layer, and the crossover line 36 and the other wirings (i.e., the first wiring 25, the second wiring 26, the third wiring 27, and the fourth wiring 28) are located in two different functional layers. The functional layer for setting the crossover line 36 may be a separate additional functional layer or a functional layer existing in the secondary display area 22, which will not be limited in the embodiment of the present disclosure. In addition, since the crossover line 36 and the third and fourth wirings 27, 28 are located in two different functional layers, the connection between the crossover line 36 and the third wiring 27 and the connection between the crossover line 36 and the fourth wiring 28 are achieved via metal via holes.

In addition, with respect to the design schemes shown in FIG. 8 and FIG. 9, the third wiring 27 and the fourth wiring 28 are converged into one wiring in the secondary display area 22 and then go away from the secondary display area 22, such that, for one pixel group 23, only three wirings need to extend outwards. Therefore, a space for one wiring may be saved compared with the design scheme as shown in FIG. 7. When a larger number of pixel groups 23 are included in the secondary display area 22, the design schemes shown in FIGS. 8 and 9 are more advantageous.

Figure 10:
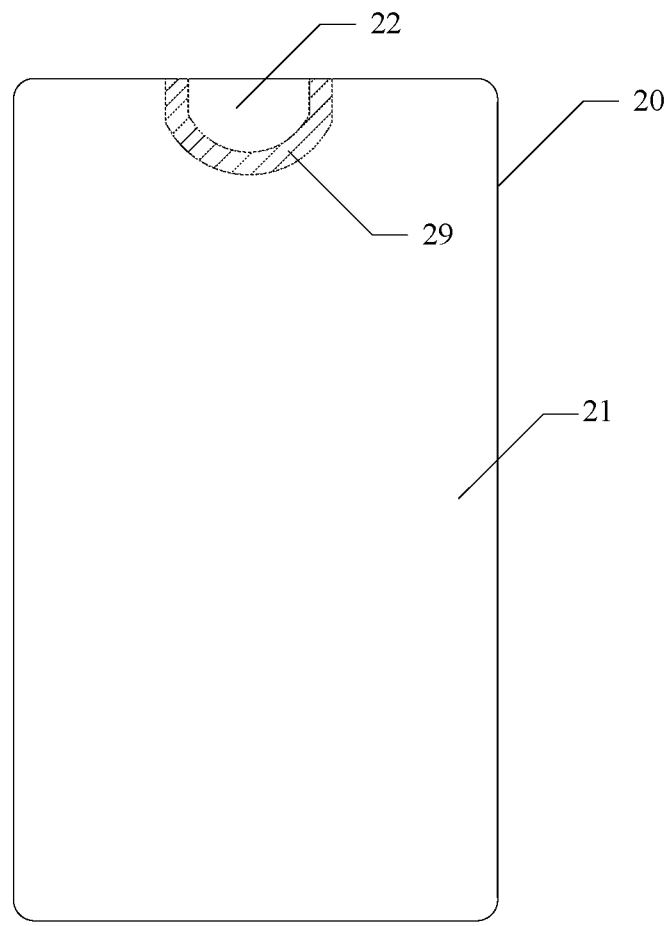
FIG. 10. is a schematic diagram of a transition display area according to some embodiments of the present disclosure.

In some embodiments, as shown in FIG. 10, the display layer 20 further includes a transition display area 29 (an area filled by oblique lines in FIG. 10), the transition display area 29 being located between the primary display area 21 and the secondary display area 22. Since the pixel distributions of the primary display area 21 and the secondary display area 22 are different, the resolutions of the primary display area 21 and the secondary display area 22 are also different, resulting in a difference in the display effects of the primary display area 21 and the secondary display area 22. The transition display area 29 is used to make the resolution transition between the primary display area 21 and the secondary display area 22 smoother and more natural, thereby improving the display effect of the entire terminal screen. For example, the resolution of the transition display area 29 may be between the resolution of the primary display area 21 and the resolution of the secondary display area 22.

In addition, when the display layer 20 further includes the transition display area 29, the pixel control circuit of the secondary display area 22 may be located in the transition display area 29 and/or the primary display area 21. The pixel control circuit of the secondary display area 22 may be entirely located in the primary display area 21, or may be entirely located in the transition display area 29, or may be partially located in the primary display area 21 with the remaining part being located in the transition display area 29.

In addition, the terminal screen provided by the embodiment of the present disclosure may be an organic light-emitting diode (OLED) screen, or may be other types of screens, such as a liquid crystal display (LCD) screen. The types of the terminal screen will not be limited in the embodiment of the present disclosure. Taking the OLED screen as an example, the display layer 20 may include a cathode, an electron transport layer, an organic light-emitting layer, a hole transport layer, and an anode which are sequentially stacked from top to bottom. The substrate 10 is located below the display layer 20 to serve as a carrier.

Figure 11:
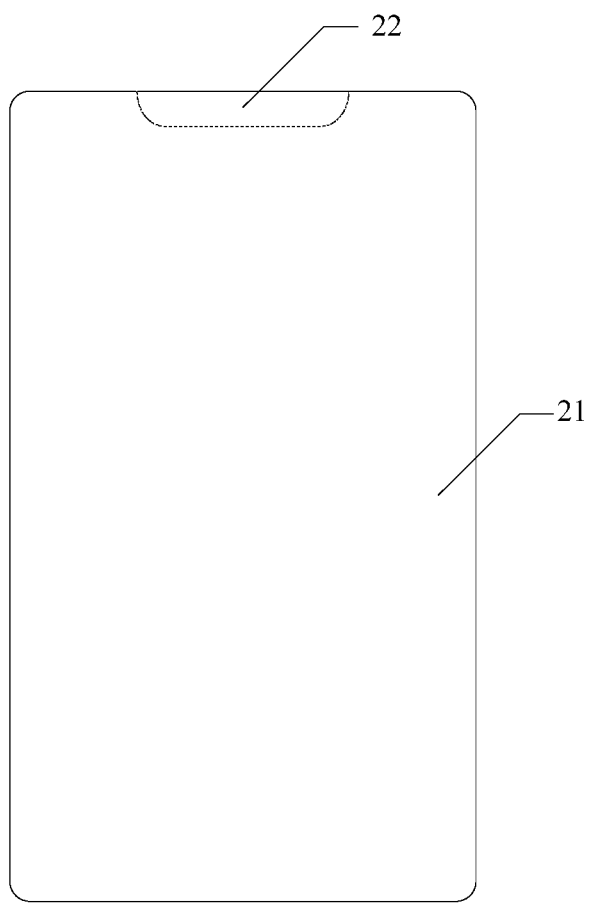
FIG. 11 is a first schematic diagram exemplarily showing several positional relationships of primary display areas and secondary display areas.
Figure 12:
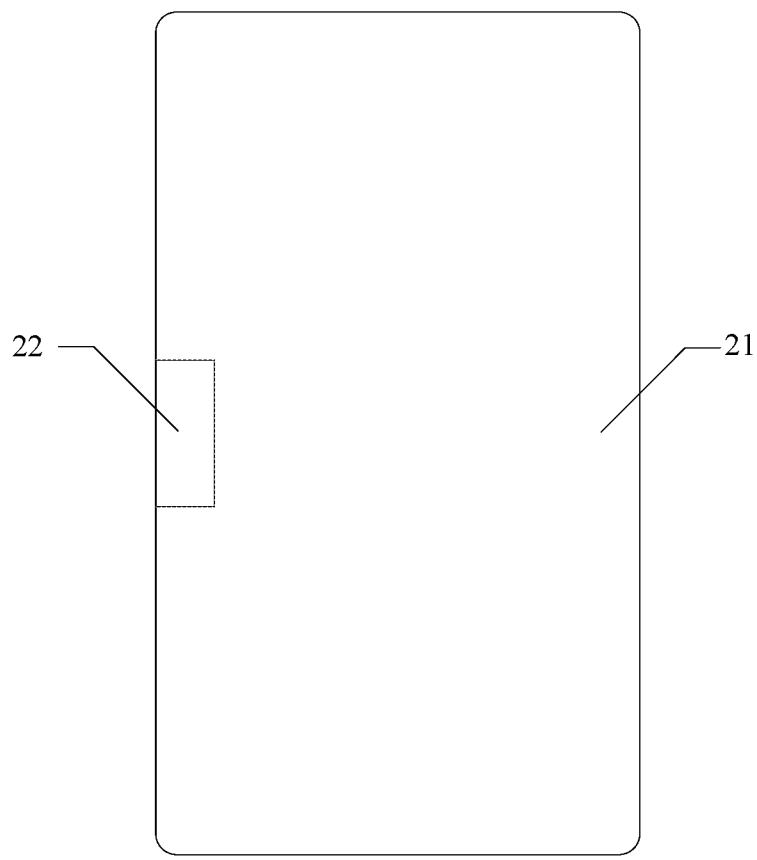
FIG. 12 is a second schematic diagram exemplarily showing several positional relationships of primary display areas and secondary display areas.
Figure 13:
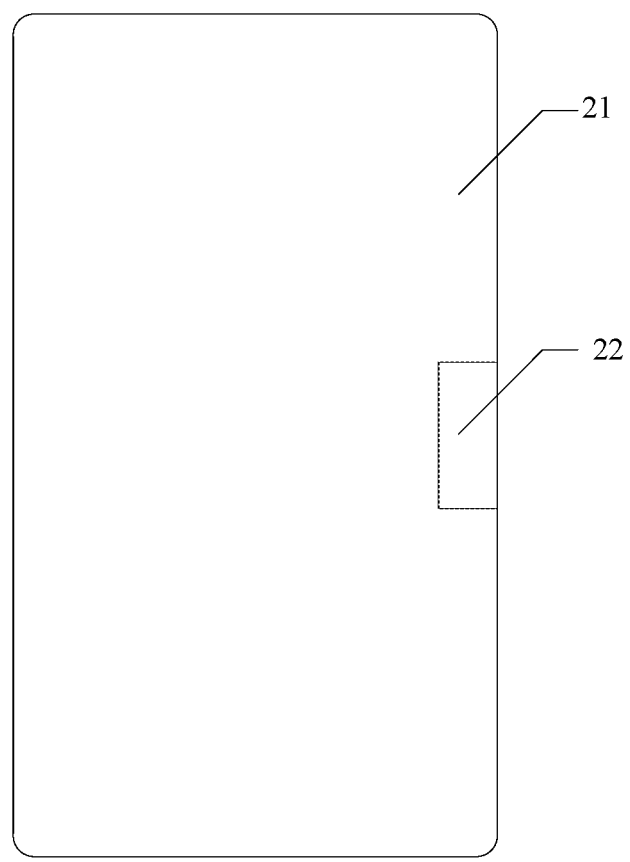
FIG. 13 is a third schematic diagram exemplarily showing several positional relationships of primary display areas and secondary display areas.
Figure 14:
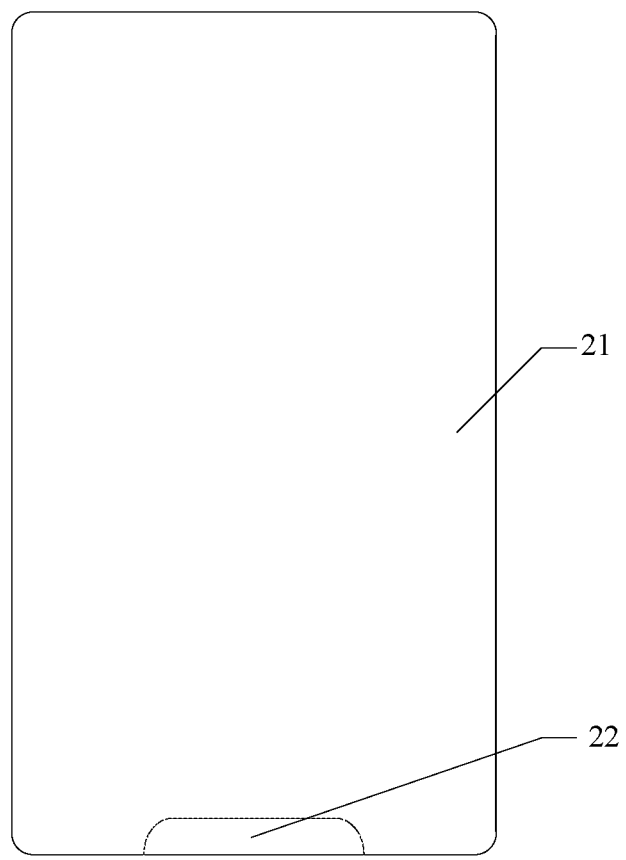
FIG. 14 is a fourth schematic diagram exemplarily showing several positional relationships of primary display areas and secondary display areas.
Figure 15:
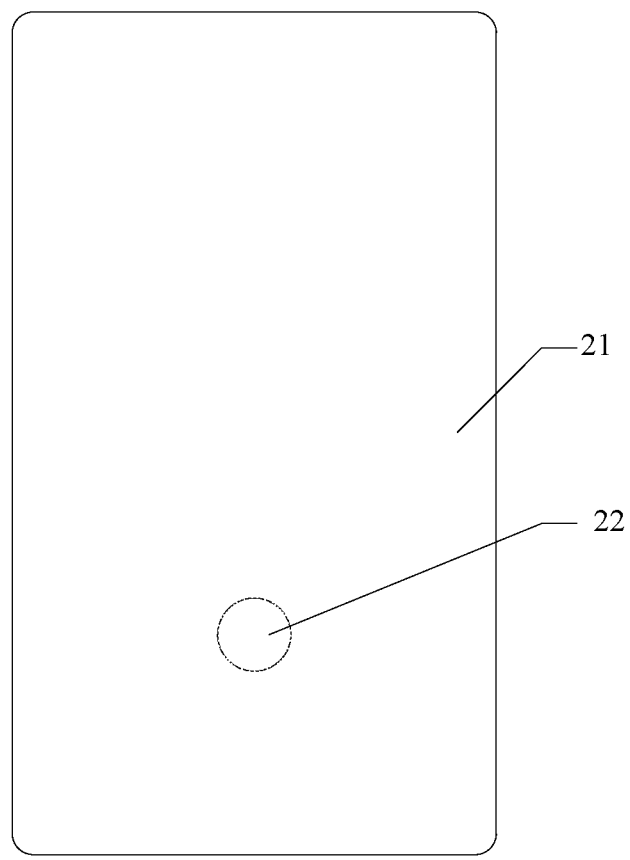
FIG. 15 is a fifth schematic diagram exemplarily showing several positional relationships of primary display areas and secondary display areas.

It should be noted that, in the embodiment of the present disclosure, the positional relationship between the secondary display area 22 and the primary display area 21 will not limited. The positional relationship between the secondary display area 22 and the primary display area 21 includes, but is not limited to any of the following cases: the secondary display area 22 is located in a notch portion formed in an edge at the top of the primary display area 21 (as shown in FIG. 11); the secondary display area 22 is located in a notch portion formed in an edge on the left side of the secondary display area 22 (as shown in FIG. 12); the secondary display area 22 is located in a notch portion formed in an edge on the right side of the primary display area 21 (as shown in FIG. 13); the secondary display area 22 is located in a notch portion formed in an edge at the bottom of the primary display area 21 (as shown in FIG. 14); and the secondary display area 22 is located in a notch portion formed in the middle of the primary display area 21 (as shown in FIG. 15), etc.

In the embodiment of the present disclosure, a cross-sectional shape of the secondary display area 22 is not limited, which may be a regular shape such as a rectangular shape, a rounded rectangle shape or a circular shape, or may be an irregular shape such as a waterdrop shape or an arc shape. In addition, the size of the secondary display area 22 is not limited in the embodiment of the present disclosure, which may be designed according to actual needs (for example, it is desired to arrange functional devices below the secondary display area 22).

Figure 16:
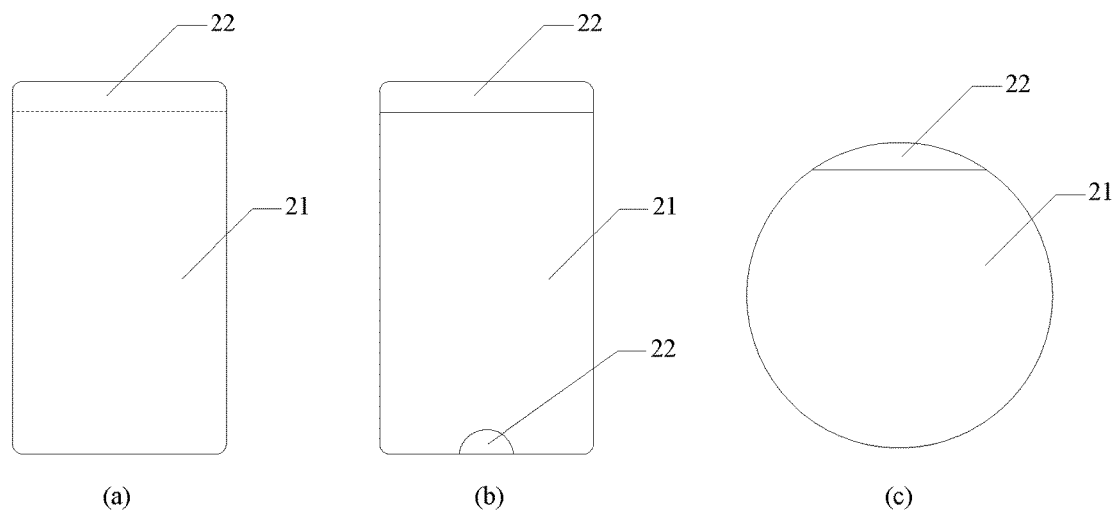
FIG. 16 is a sixth schematic diagram exemplarily showing several positional relationships of primary display areas and secondary display areas.

In addition, in an example as shown in FIGS. 11 to 15, an exemplary explanation is made by taking a notch portion being formed in the edge or in the middle of the primary display area 21 and the secondary display area 22 being located in the notch portion as an example. In some other possible embodiments, there may be no notch portion being formed on the primary display area 21, and the secondary display area 22 is located beside a side of the primary display area 21 and is closely connected to the primary display area 21. Alternatively, the display layer 20 may also include both a secondary display area 22 in the notch portion formed on the primary display area 21, and a secondary display area 22 located beside a side of the primary display area 21. FIG. 16 exemplarily shows several possible positional relationships between the primary display areas 21 and the secondary display areas 22.

In some embodiments, the terminal screen is in a regular shape which includes any one of the followings: a rectangular shape, a rounded rectangle shape or a circular shape. Of course, in some other possible embodiments, the terminal screen may be in an irregular shape, which will not be limited in the present disclosure.

Some embodiments of the present disclosure further provide a terminal. The terminal may be an electronic device such as a mobile phone, a tablet computer, an e-book reader, a multimedia playback device, a wearable device, an in-vehicle terminal, or the like. The terminal includes the terminal screen as provided in the embodiment of FIG. 2 or any of the alternative embodiments described above.

Figure 17:
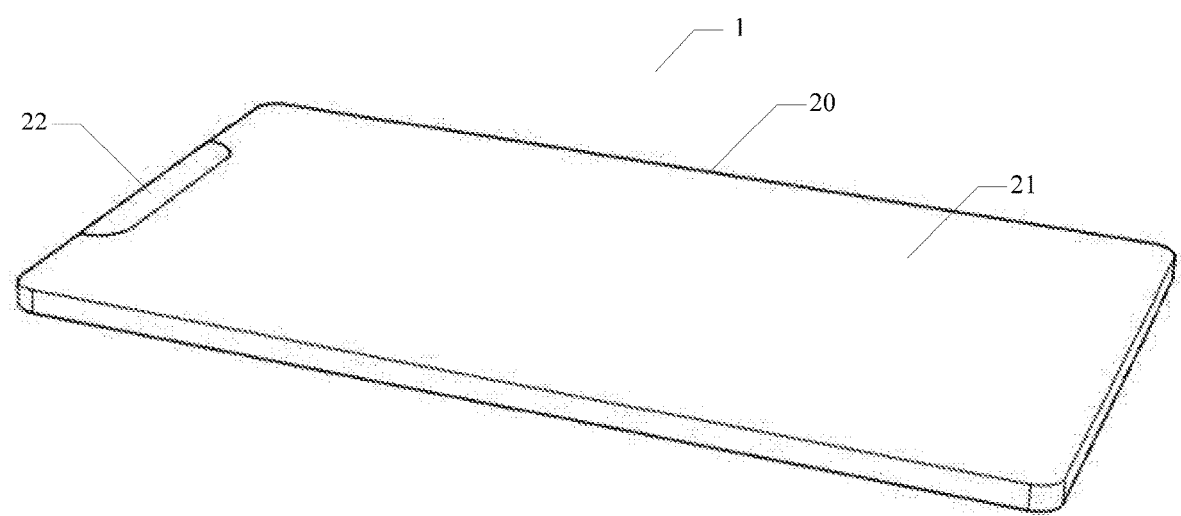
FIG. 17 is a schematic diagram of a terminal according to some embodiments.

In an example, as shown in FIG. 17, the terminal 1 includes a terminal screen. The terminal screen includes a substrate (not shown in FIG. 17), and a display layer 20 located on the substrate. In some embodiments, a touch sensitive layer and a glass cover may also be included over the display layer 20.

As shown in FIG. 17, The display layer 20 includes a primary display area 21 and a secondary display area 22. In FIG. 17, an introduction is made only by taking a case where the display layer 20 includes a secondary display area 22 which is located in a notch portion formed in an edge at the top of the primary display area 21, and the secondary display area 22 and the primary display area 21 jointly form a display layer 20 with a cross-section being in a rounded rectangle shape as example. There may be other positional relationships between the secondary display area 22 and the primary display area 21, which will not be limited in the embodiment of the present disclosure.

In an embodiment of the present disclosure, the secondary display area 22 includes a plurality of pixels, each pixel including sub-pixels of three different colors, including a first color, a second color, and a third color. In the secondary display area 22, the wiring for connecting the sub-pixels of the first color, the wiring for connecting the sub-pixels of the second color, and the wiring for connecting the sub-pixels of the third color are located in the same layer. The related description of the secondary display area 22 and the primary display area 21 may refer to the above embodiments, and will not be described in the present embodiment again.

In addition, according to the terminal provided by the embodiment of the present disclosure, optical devices (not shown in FIG. 17) are arranged below the secondary display area 22. The optical devices include, but are not limited to, at least one of the followings: a camera, a light sensor, a proximity sensor, an optical transmitter, and an optical receiver. The camera is used to implement a shooting function, which may be, for example, a common camera, an infrared camera, a depth camera, and the like. The light sensor is used to acquire the intensity of ambient light. The proximity sensor is used to acquire a distance away from an object in front. The optical transmitter is a functional device used to emit light, which may be, for example, an infrared transmitter or some transmitters that emit other light. The optical receiver is a functional device used to receive light, which may be, for example, an infrared receiver or some receivers used to receive other light.

In some embodiments, the functional devices arranged below the secondary display area 22 may include other functional devices such as an earpiece, a biosensor, an environmental sensor, a food safety detection sensor or a health sensor, in addition to the optical devices as described above. The earpiece is used to implement a sound playback function. The biosensor used to identify biological features of users, which may be, for example, a fingerprint recognition sensor, an iris recognition sensor, or the like. The environmental sensor is used to acquire environmental information, which may be, for example, a temperature sensor, a humidity sensor, an air pressure sensor, or the like. The food safety detection sensor is used to detect indicators of some harmful substances in food, which may be, for example, an optical sensor, a biometric sensor, or the like. The health sensor is used to acquire health information of users, which may be, for example, a sensor for acquiring the user's heart rate, blood pressure, heartbeat or other human body data.

One or more functional devices may be arranged below the secondary display area 22. For example, a camera and a proximity sensor may be arranged below a secondary display area 22. In addition, when the display layer 20 includes a plurality of secondary display areas 22, the functional devices may be or may not be arranged below some secondary display area 22. In addition, the same or different functional devices may be arranged below the two different secondary display areas 22. For example, a camera and a proximity sensor may be arranged below one secondary display area 22, and a fingerprint recognition sensor may be arranged below the other secondary display area 22.

In the embodiment of the present disclosure, the wirings for the sub-pixels of three different colors in the secondary display area are arranged in the same layer, such that the number of layers of the terminal screen may be reduced, and metal via holes for connecting the wirings and the sub-pixels across layers are not required, thereby further improving the light transmittance of the terminal screen. In this way, optical devices such as a camera, a light sensor, a proximity sensor, an optical transmitter and an optical receiver may be arranged below the secondary display area. In addition, these optical devices can be ensured to work normally to furthest ensure the working performances of the optical devices.

Some embodiments of the present disclosure further provide a terminal screen. The terminal screen includes a plurality of pixels, each pixel including sub-pixels of at least three different colors, including a first color, a second color, and a third color. In the terminal screen, a wiring for connecting the sub-pixels of the first color, a wiring for connecting the sub-pixels of the second color, and a wiring for connecting the sub-pixels of the third color are located in the same layer.

In some embodiments, the wiring for connecting the sub-pixels of the first color, the wiring for connecting the sub-pixels of the second color, the wiring for connecting the sub-pixels of the third color, the sub-pixels of the first color, the sub-pixels of the second color and the sub-pixels of the third color are all located in the same layer.

In some embodiments, the terminal screen includes at least one pixel group, each of the pixel groups including n pixel units which are arranged in a first direction, where n is an integer greater than 1.

The n pixel units include first pixel units and second pixel units that are arranged alternately in a first direction. Each of the first pixel units includes three sub-pixels arranged in a second direction, and the arrangement sequence of the three sub-pixels included in the first pixel unit is as follows: the sub-pixel of the first color, the sub-pixel of the second color, and the sub-pixel of the third color. The second pixel unit includes three sub-pixels arranged in the second direction, and the arrangement sequence of the three sub-pixels included in the second pixel unit is as follows: the sub-pixel of the third color, the sub-pixel of the first color and the sub-pixel of the second color. The first direction is perpendicular to the second direction.

For each pixel group, the sub-pixels of the first color in each first pixel unit and the sub-pixels of the first color in each second pixel unit are sequentially connected one by one by a first wiring; the sub-pixels of the second color in each first pixel unit and the sub-pixels of the second color in each second pixel unit are sequentially connected one by one by a second wiring; the sub-pixels of the third color in each first pixel unit are sequentially connected one by one by a third wiring; and the sub-pixels of the third color in each second pixel unit are sequentially connected one by one by a fourth wiring. The first wiring, the second wiring, the third wiring and the fourth wiring are located in the same layer.

The pixel arrangement manner and the wiring manner of the terminal screen are the same as or similar to those of the second display area in the above embodiments. The pixel arrangement manner and the wiring manner of the terminal screen may refer to the description in the above embodiments, and will not be repeated herein. In addition, the details that are not disclosed in the present embodiment may refer to the above embodiments.

In the embodiment of the present disclosure, the wirings for the sub-pixels of three different colors in the terminal screen are arranged in the same layer, such that the number of layers of the terminal screen may be reduced, and metal via holes for connecting the wirings and the sub-pixels across layers are not required, thereby further improving the light transmittance of the terminal screen. In this way, optical devices such as a camera, a light sensor, a proximity sensor, an optical transmitter and an optical receiver may be arranged below the terminal screen. In addition, these optical devices can be ensured to work normally to furthest ensure the working performances of the optical devices.

Some embodiments of the present disclosure further provide a terminal. The terminal may be an electronic device such as a mobile phone, a tablet computer, an e-book reader, a multimedia playback device, a wearable device, an in-vehicle terminal, or the like. The terminal includes the terminal screen as provided in the above embodiments.

Figure 18:
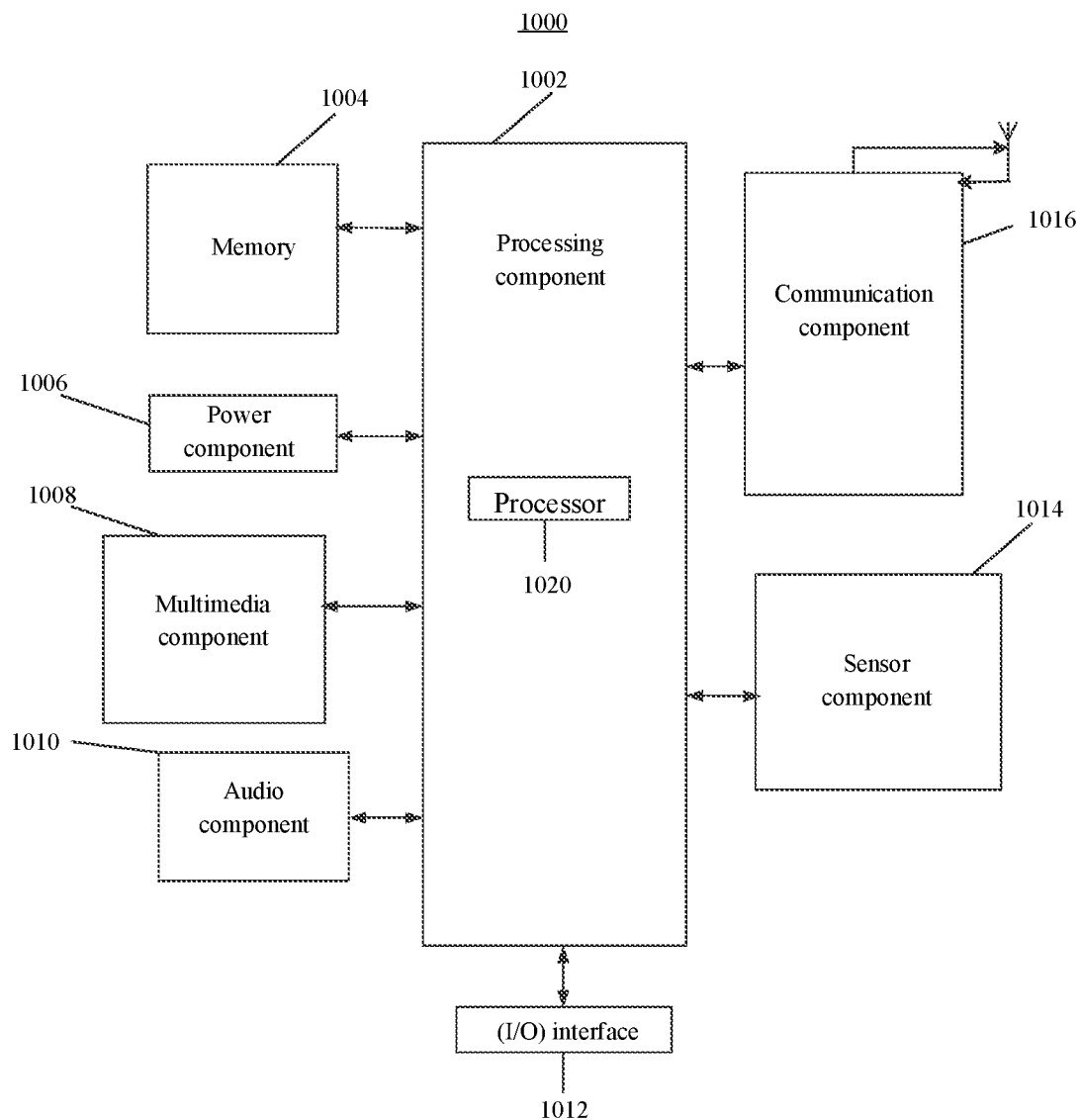
FIG. 18. is a block diagram of a terminal according to some embodiments.

FIG. 18 is a block diagram of an apparatus 600 in accordance with some embodiments. For example, the apparatus 600 may be a mobile phone, a computer, a digital broadcast terminal, a messaging device, a gaming console, a tablet device, a medical device, a fitness equipment, a personal digital assistant, and the like.

Referring to FIG. 6, the apparatus 600 may include one or more of the following components: a processing component 602, a memory 604, a power component 606, a multimedia component 608, an audio component 610, an input/output (I/O) interface 612, a sensor component 614, and a communication component 616.

The processing component 602 typically controls the overall operations of the apparatus 600, such as the operations associated with display, telephone calls, data communications, camera operations, and recording operations. The processing component 602 may include one or more processors 620 to execute instructions to perform all or part of the steps in the above described methods. Moreover, the processing component 602 may include one or more modules which facilitate the interaction between the processing component 602 and other components. For instance, the processing component 602 may include a multimedia module to facilitate the interaction between the multimedia component 608 and the processing component 602.

The memory 604 is configured to store various types of data to support the operation of the apparatus 600. Examples of such data include instructions for any applications or methods operated on the apparatus 600, contact data, phonebook data, messages, pictures, videos, etc. The memory 604 may be implemented by using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 606 provides power to various components of the apparatus 600. The power component 606 may include a power management system, one or more power sources, and any other components associated with the generation, management, and distribution of power in the apparatus 600.

The multimedia component 608 includes a screen providing an output interface between the apparatus 600 and the user. In some embodiments, the screen may include a liquid crystal display (LCD) and a touch panel (TP). If the screen includes the touch panel, the screen may be implemented as a touch screen to receive input signals from the user. The touch panel includes one or more touch sensors to sense touches, swipes, and gestures on the touch panel. The touch sensors may not only sense a boundary of a touch or swipe action, but also sense the duration and pressure associated with the touch or swipe action. In some embodiments, the multimedia component 608 includes a front camera and/or a rear camera. The front camera and the rear camera may receive external multimedia data while the apparatus 600 is in an operation mode, such as a photographing mode or a video mode. Each of the front camera and the rear camera may be a fixed optical lens system or have focus and optical zoom capability.

The audio component 610 is configured to output and/or input audio signals. For example, the audio component 610 includes a microphone (MIC) configured to receive external audio signals when the apparatus 600 is in an operation mode, such as a call mode, a recording mode, and a voice recognition mode. The received audio signal may be further stored in the memory 604 or transmitted via the communication component 616. In some embodiments, the audio component 610 further includes a speaker for outputting audio signals.

The I/O interface 612 provides an interface between the processing component 602 and peripheral interface modules, such as a keyboard, a click wheel, buttons, and the like. The buttons may include, but are not limited to, a home button, a volume button, a start button, and a lock button.

The sensor component 614 includes one or more sensors to provide status assessments of various aspects of the apparatus 600. For instance, the sensor component 614 may detect an on/off status of the apparatus 600, relative positioning of components, e.g., the display device and the mini keyboard of the apparatus 600, and the sensor component 614 may also detect a position change of the apparatus 600 or a component of the apparatus 600, presence or absence of user contact with the apparatus 600, orientation or acceleration/deceleration of the apparatus 600, and temperature change of the apparatus 600. The sensor component 614 may include a proximity sensor configured to detect the presence of nearby objects without any physical contact. The sensor component 614 may also include a light sensor, such as a CMOS or CCD image sensor, used for imaging applications. In some embodiments, the sensor component 614 may also include an accelerometer sensor, a gyroscope sensor, a magnetic sensor, a pressure sensor, or a temperature sensor.

The communication component 616 is configured to facilitate communication, wired or wirelessly, between the apparatus 600 and other devices. The apparatus 600 can access a wireless network based on a communication standard, such as Wi-Fi, 2G, 3G, 4G or 5G, or a combination thereof. In some embodiments, the communication component 616 receives broadcast signals or broadcast associated information from an external broadcast management system via a broadcast channel. In some embodiments, the communication component 616 further includes a near field communication (NFC) module to facilitate short-range communications.

It is to be understood that the term "plurality" herein refers to two or more. "And/or" herein describes the correspondence of the corresponding objects, indicating three kinds of relationship. For example, A and/or B, can be expressed as: A exists alone, A and B exist concurrently, B exists alone. The character "/" generally indicates that the context object is an "OR" relationship.

Those of ordinary skill in the art will understand that the above described modules/units can each be implemented by hardware, or software, or a combination of hardware and software. Those of ordinary skill in the art will also understand that multiple ones of the above described modules/units may be combined as one module/unit, and each of the above described modules/units may be further divided into a plurality of sub-modules/sub-units.

In the present disclosure, it is to be understood that the terms "lower," "upper," "center," "longitudinal," "transverse," "front," "left," "right," "top," "bottom," "outside," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, the terms "connected," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable sub combinations.

Moreover, although features may be described above as acting in certain combinations and even initially claimed as such, one or more features from a claimed combination can in some cases be excised from the combination, and the claimed combination may be directed to a subcombination or variations of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing may be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

In the present disclosure, a first element being "on," "below" a second element may indicate direct contact between the first and second elements, without contact, or indirect through an intermediate medium, unless otherwise explicitly stated and defined.

Moreover, a first element being "above" a second element may indicate that the first element is directly above the second element, or merely that the first element is at a level higher than the second element. The first element "below" the second element may indicate that the first element is directly below the second element, or merely that the first element is at a level lower than the second feature. The first and second elements may or may not be in contact with each other.

In the description of the present disclosure, the terms "some embodiments," or "example" and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described may be combined in a suitable manner in any one or more embodiments or examples. In addition, various embodiments or examples described in the specification, as well as features of various embodiments or examples, may be combined and reorganized.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing may be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A terminal screen, comprising a substrate, and a display layer on the substrate, wherein
   the display layer comprises a primary display area and a secondary display area;
   the secondary display area comprises at least one pixel group, each pixel group comprising n pixel units which are arranged in a first direction, where n is an integer greater than 1;
   the n pixel units comprise first pixel units and second pixel units that are arranged alternately in the first direction; wherein the first pixel unit comprises three sub-pixels arranged in a second direction, and the arrangement sequence of the three sub-pixels comprised in the first pixel unit is as follows: the sub-pixel of a first color, the sub-pixel of a second color, and the sub-pixel of a third color; the second pixel unit comprises three sub-pixels arranged in the second direction, and the arrangement sequence of the three sub-pixels comprised in the second pixel unit is as follows: the sub-pixel of the third color, the sub-pixel of the first color and the sub-pixel of the second color; the first direction is perpendicular to the second direction; the first color, the second color and the third color are different from each other;
   for each pixel group, the sub-pixels of the first color in the first pixel units and the second pixel units are sequentially connected one by one by a first wiring; the sub-pixels of the second color in the first pixel units and the second pixel units are sequentially connected one by one by a second wiring; the sub-pixels of the third color in the first pixel units are sequentially connected one by one by a third wiring; the sub-pixels of the third color in the second pixel units are sequentially connected one by one by a fourth wiring; and the first wiring, the second wiring, the third wiring and the fourth wiring are in a same layer.

2. The terminal screen according to claim 1, wherein the wiring for connecting the sub-pixels of the first color, the wiring for connecting the sub-pixels of the second color, the wiring for connecting the sub-pixels of the third color, the sub-pixels of the first color, the sub-pixels of the second color and the sub-pixels of the third color are all in a same layer.

3. The terminal screen according to claim 1, wherein
the third wiring extends outwards from the secondary display area and is connected to a first pixel control circuit outside the secondary display area; and
the fourth wiring extends outwards from the secondary display area and is connected to a second pixel control circuit outside the secondary display area.

4. The terminal screen according to claim 3, wherein
the first pixel control circuit and the second pixel control circuit are the same pixel control circuit.

5. The terminal screen according to claim 3, wherein
the first pixel control circuit and the second pixel control circuit are different pixel control circuits.

6. The terminal screen according to claim 1, wherein there is one of:
the third wiring being connected to the fourth wiring in the secondary display area, and the fourth wiring extending outwards from the secondary display area and being connected to a pixel control circuit outside the secondary display area;
and
the fourth wiring being connected to the third wiring in the secondary display area, and the third wiring extending outwards from the secondary display area and being connected to the pixel control circuit outside the secondary display area.

7. The terminal screen according to claim 6, the first wiring, the second wiring, the third wiring and the fourth wiring are in a first layer;
a second layer is above the first layer and comprises a crossover line;
one end of the third wiring is connected to one end of the crossover line, and the another end of the crossover line is connected to the fourth wiring.

8. The terminal screen according to claim 6, the first wiring, the second wiring, the third wiring and the fourth wiring are in a first layer;
a second layer is above the first layer and comprises a crossover line;
one end of the fourth wiring is connected to one end of the crossover line, and the another end of the crossover line is connected to the third wiring.

9. The terminal screen according to claim 6, wherein the first wiring, the second wiring, the third wiring and the fourth wiring are in a first layer;
a second layer is below the first layer and comprises a crossover line;
one end of the third wiring is connected to one end of the crossover line, and the another end of the crossover line is connected to the fourth wiring.

10. The terminal screen according to claim 6, wherein the first wiring, the second wiring, the third wiring and the fourth wiring are in a first layer;
a second layer is below the first layer and comprises a crossover line;
one end of the fourth wiring is connected to one end of the crossover line, and the another end of the crossover line is connected to the third wiring.

11. The terminal screen according to claim 1, wherein there is at least one of:
the first color being red, the second color being green, and the third color being blue;
the first color being red, the second color being blue, and the third color being green;
the first color being green, the second color being red, and the third color being blue;
the first color being green, the second color being blue, and the third color being red;
the first color being blue, the second color being red, and the third color being green; or
the first color being blue, the second color being green, and the third color being red.

12. The terminal screen according to claim 1, wherein the display layer further comprises a transition display area, the transition display area being between the primary display area and the secondary display area.

13. The terminal screen according to claim 1, wherein there is at least one of:
the secondary display area in a notch portion formed in an edge at the top of the primary display area;
the secondary display area in a notch portion formed in an edge on the left side of the primary display area;
the secondary display area in a notch portion formed in an edge on the right side of the primary display area;
the secondary display area in a notch portion formed in an edge at the bottom of the primary display area; or
the secondary display area in a notch portion formed in the middle of the primary display area.

14. A terminal, comprising the terminal screen according to claim 1.

15. The terminal according to claim 14, wherein
an optical device is below the secondary display area.

16. The terminal according to claim 15, wherein the optical device comprises at least one of the followings: a camera, a light sensor, a proximity sensor, an optical transmitter, and an optical receiver.

17. A terminal screen, comprising
at least one pixel group, each pixel group comprising n pixel units which are arranged in a first direction, where n is an integer greater than 1,
the n pixel units comprise first pixel units and second pixel units that are arranged alternately in the first direction; wherein the first pixel unit comprises three sub-pixels arranged in a second direction, and the arrangement sequence of the three sub-pixels comprised in the first pixel unit is as follows: the sub-pixel of a first color, the sub-pixel of a second color, and the sub-pixel of a third color; the second pixel unit comprises three sub-pixels arranged in the second direction, and the arrangement sequence of the three sub-pixels comprised in the second pixel unit is as follows: the sub-pixel of the third color, the sub-pixel of the first color and the sub-pixel of the second color; the first direction is perpendicular to the second direction; the first color, the second color and the third color are different from each other;
for each pixel group, the sub-pixels of the first color in the first pixel units and the second pixel units are sequentially connected one by one by a first wiring; the sub-pixels of the second color in the first pixel units and the second pixel units are sequentially connected one by one by a second wiring; the sub-pixels of the third color in the first pixel units are sequentially connected one by one by a third wiring; the sub-pixels of the third color in the second pixel units are sequentially connected one by one by a fourth wiring; and the first wiring, the second wiring, the third wiring and the fourth wiring are in a same layer.

18. A terminal, comprising the terminal screen according to claim 17.

* * * * *